United States Patent
Chaware et al.

(10) Patent No.: US 7,338,842 B2
(45) Date of Patent: Mar. 4, 2008

(54) PROCESS FOR EXPOSING SOLDER BUMPS ON AN UNDERFILL COATED SEMICONDUCTOR

(75) Inventors: Raghunandan Chaware, Huntington Beach, CA (US); Christopher Dominic, Cerritos, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 312 days.

(21) Appl. No.: 11/168,236

(22) Filed: Jul. 22, 2005

(65) Prior Publication Data

US 2007/0020815 A1  Jan. 25, 2007

(51) Int. Cl.
  *H01L 21/48* (2006.01)
(52) U.S. Cl. .................. 438/127; 438/126; 438/613

(58) Field of Classification Search ................ 438/124, 438/126–127, 614–613; 257/E21.508
See application file for complete search history.

(56) References Cited

U.S. PATENT DOCUMENTS

| 6,000,127 | A | 12/1999 | Eifuku et al. |
| 6,179,198 | B1 | 1/2001 | Eifuku et al. |
| 6,209,196 | B1 | 4/2001 | Ozono et al. |
| 6,333,206 | B1 * | 12/2001 | Ito et al. .................. 438/106 |
| 2005/0048693 | A1 | 3/2005 | Yoon |
| 2006/0134901 | A1 * | 6/2006 | Chaware et al. ............ 438/612 |

* cited by examiner

*Primary Examiner*—Thanhha S. Pham
(74) *Attorney, Agent, or Firm*—Michelle Simpson; Jane E. Gennaro (57) ABSTRACT

A process for applying a solvent-free underfill onto a bumped semiconductor comprises: providing an underfill in a compressible state on a semiconductor, contacting the underfill with a compliant surface and applying sufficient pressure to expose the bumps, optionally hardening the underfill to a solid state, and removing the compliant surface.

14 Claims, 7 Drawing Sheets

Inventive underfill application process

FIGURE 1: Current Pre-Applied Assembly Process

FIGURE 2: Hot Melt Printing Process and Removal of Underfill to Expose Bumps

FIGURE 3: Inventive underfill application process

FIGURE 4: Example 1 cross-section, hot print method

FIGURE 5: Example 2 cross-section, hot powder coating method

FIGURE 6: Example 3 cross-section, inventive process

FIGURE 7: Example 4 cross section, inventive process attached to substrate

PROCESS FOR EXPOSING SOLDER BUMPS ON AN UNDERFILL COATED SEMICONDUCTOR

FIELD OF THE INVENTION

This invention relates to a process for applying a solvent-free underfill to a semiconductor wafer or die prior to attachment to a substrate. This is commonly called pre-applied underfill.

BACKGROUND OF THE INVENTION

In the construction of semiconductor assemblies, semiconductor dies or chips are both electrically and mechanically attached to substrates. In one method of attach, the face of the die containing electrical terminal pads and circuitry, the active face, is bumped with deposits of solder. These solder bumps are aligned and contacted with corresponding terminals on the substrate, the solder is heated to its melting point or "reflow" temperature to form solder joints, enabling mechanical support and electrical interconnections between the semiconductor die and the substrate.

Differences between the coefficient of thermal expansion (CTE) of the die and the substrate often require that the space between the die and the substrate be filled with a reinforcing material, commonly known as underfill, to absorb the stresses created by the CTE differential. Such underfill materials can be applied using at least three different methods.

In the method known as "capillary flow", the semiconductor die is attached to the substrate through solder interconnections, and then an underfill material is dispensed around the edges of the gap existing between the semiconductor die and the substrate. The underfill is drawn into the gap by capillary action and then cured.

In the method known as "no flow", the underfill material is dispensed onto a substrate and the semiconductor chip or die is placed onto the substrate. Placement is made such that the solder bumps on the chip are in contact with the corresponding pads on the substrate before the connection by solder reflow. Typically, the underfill is cured during the solder reflow step, though sometimes an additional cure step is required. No flow assembly can also be performed using thermal compression bonding. In this method, the no flow underfill is dispensed on the substrate, the die is placed on the substrate and heat and pressure is applied to the die and/or the substrate to achieve reflow as well as interconnection. As the pressure and heat is applied, the underfill flows out to form fillets and also allows the solder bumps to make interconnection with the pads. The underfill may require an additional cure step.

Capillary and no flow underfill methods are time-consuming due to the fact that they are conducted at the die level. Another major drawback of the no flow system is that if the no flow underfill is a filled system, then filler can interfere with soldering. In addition, the no flow method would require new industry infrastructure to support the thermal compression bonding required, instead of the surface mount technology processes that are standard today.

The method known as "pre-applied" involves applying the underfill onto the active side of a full silicon wafer that has been bumped with solder and singulating the wafer into individual dies at that stage. One key advantage of the "pre-applied" method is the ability to use standard "pick and place" equipment to attach the die to the substrate.

In the main, pre-applied underfills rely on solvent-based adhesive systems in which the solvent must be removed and/or the underfill partially cured to form a solid layer. This process, removing solvent and/or partially curing is known as B-staging. After the underfill is B-staged, the wafer is diced into individual chips. In some operations, a back grinding process to thin the silicon to a controlled thickness may precede the singulation process. The solder balls on the active face are aligned with the terminals on the substrate and the chip is placed on the substrate. The solder is reflowed to form electrical interconnection. If the underfill is not completely cured during solder reflow, a separate underfill cure step may follow.

Figure 1:
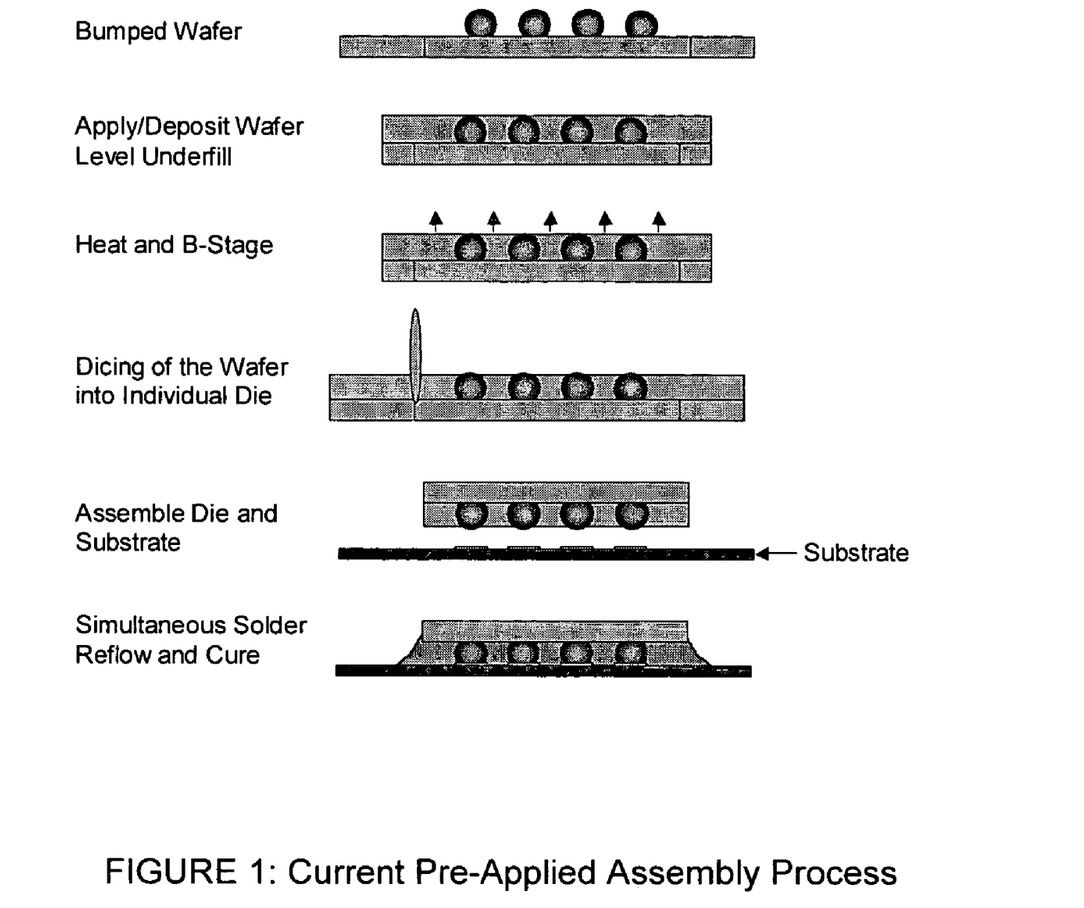
FIG. 1 depicts the current pre-applied assembly process.

The current process employed for the assembly of die with wafer level underfill is shown in FIG. 1. Although this wafer level process has some advantages over capillary flow and no-flow, it does have some disadvantages. If the B-stage conditions are not optimized, residual solvent in the wafer level underfill can outgas during reflow, causing voids (which ultimately can lead to failed devices), impeding good solder connections (cold solder joints) or areas that are not contacted by the underfill (non-wets). Further, as the thickness of the underfill layer increases beyond 200 micrometers, removal of solvent from the underfill becomes very difficult. The residual solvent outgases during reflow, causing voids and non-wets. Solvent removal is an additional step in the process and the removed solvent must be disposed of in an environmentally conscious way.

Figure 2:
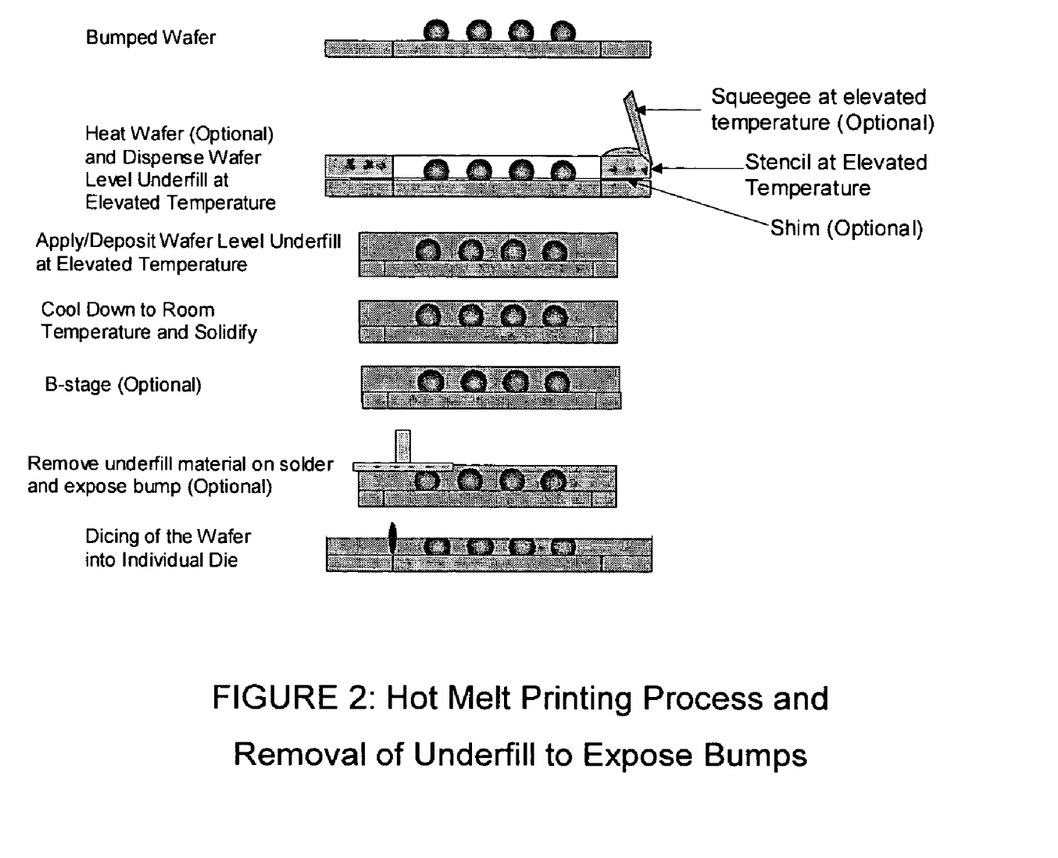
FIG. 2 depicts a hot melt printing process and removal of underfill to expose bumps.

The invention described in provisional U.S. patent application No. 60/638,337 provided a process and composition for a solvent-free wafer level underfill that enables coatings above 200 micrometers and is shown in FIG. 2. The process as described requires the removal of a layer of underfill in order to expose the bumps and enable die attach and electrical interconnection using standard pick and place equipment. Underfill removal can be achieved using a number of methods, including mechanical abrasion or chemical etching. However, the removal of this underfill layer can be problematic. Mechanical grinding has to be fairly aggressive, and a wet process must be used to minimize heat generation that might melt and smear the solder balls. This process step generates contaminated water that must be disposed of, and introduces moisture into a moisture-sensitive process. Chemical etching results in solvent waste, which must be disposed of in an environmentally sensitive fashion.

In some cases the die may be attached to a substrate without removing the layer of underfill over the bumps if the method known as thermal compression bonding is employed. However, this method requires the purchase of special equipment that is not standard within the industry, and its use would reduce the net cost benefits of the pre-applied underfill coating.

SUMMARY OF THE INVENTION

This invention provides a solution to the above problems by providing a process for exposing the solder bumps on an underfill coated semiconductor using a compliant material to press the underfill. This process may be utilized at either the die or the wafer level.

The principle advantage of this process is that it results in exposed bumps that can be directly attached to the terminals on the substrate using standard "pick and place" equipment to perform the attach operations. This eliminates the need to use thermal compression bonding or to remove excess underfill from the coated semiconductor.

DETAILED DESCRIPTION OF THE INVENTION

This a process for applying a solvent-free underfill onto a semiconductor having an array of solder bumps on a surface of the semiconductor. The process comprises: (a) providing an underfill in a compressible state on the semiconductor, (b) contacting the underfill with a compliant surface and applying sufficient pressure to expose the bumps, (c) optionally, hardening the underfill to a solid state, and (d) removing the compliant surface.

In one embodiment the underfill is deposited onto the semiconductor as a solid. The form of the solid must be capable of providing a coating across the surface of the semiconductor that is substantially uniform in thickness and in composition such as can be accomplished with powders, particulates, films, or sheets. The solid underfill is then converted to a compressible state by melting via conventional heating methods such as contact, convection, or infrared. Depending on the application method used, the semiconductor may be at room temperature or heated to a temperature between room temperature and the application temperature of the adhesive.

In a second embodiment the underfill is deposited onto the semiconductor as a liquid. The liquid state can be achieved either by using an underfill that is liquid at room temperature or by pre-heating an underfill that is solid at room temperature above its melting point. The liquid application method employed must be capable of distributing the liquid underfill onto the semiconductor in a layer that is substantially uniform in thickness and in composition. The application of the liquid underfill in a uniform layer can be accomplished by one or more techniques. The usual techniques include stencil printing, screen printing, "hot melt" printing, jetting, spin coating, injection molding, and transfer molding. Depending on the application method used the semiconductor may be at room temperature or heated to a temperature between room temperature and the application temperature of the adhesive.

After the underfill has been deposited on the semiconductor and is in a liquid state, a vacuum may be applied to the coated semiconductor to effect the removal of any entrapped air from the underfill. This is an optional process step and its utility will depend on such factors as the specific underfill used, the deposition method, and the bump layout and height. The amount of vacuum required is dependent on the viscosity of the underfill and amount of entrapped air and can be determined by the practitioner without undue experimentation.

The compliant surface of this invention comprises any material that allows the bumps on the semiconductor to indent into the material without flattening them, and that is capable of pressing the underfill below and around the top surface of the bumps. The compliant material selected should be tailored to the specific manufacturing conditions utilized and will depend on such factors as the hardness of the bump metallurgy, processing temperatures employed, and underfill rheology. Materials with Shore A hardness in the range of 45-80 are appropriate, however, materials that are harder or softer could also work depending on the assembly configuration and manufacturing conditions.

The layer of compliant material can be any thickness as long as it is thicker than the height of bump exposure that is required. The amount of bump exposure required ranges from 3-20% of the bump height and should be sufficient to enable the camera on the pick and place equipment to recognize the bump for alignment purposes, and such that enough bump metal is exposed to enable reflow and the formation of a solder joint with the bond pads. The optimum amount of bump exposure can be determined by the practitioner for specific operations without undue experimentation.

The compliant material must also be resistant to the processing temperatures that will be used in the particular manufacturing environment and its selection is within the capability of the practitioner without undue experimentation. In a preferred embodiment the compliant material is inherently releasable from the underfill and bumps, however, a secondary material such as a silicone release coating applied to the compliant material could be used to prevent the underfill from sticking to the compliant material. In a preferred embodiment the compliant material recovers its original shape after being released from the semiconductor, enabling repeated uses of the same material. Silicone rubber is one exemplary compliant material that exhibits this behavior. However, if desired, a compliant material that does not recover its shape could be used and disposed of after a single use. Exemplary compliant materials that exhibit this behavior include but are not limited to mylar or polyethylene sheets.

The compliant surface may be pressed against the underfill and bumps using either positive or negative pressure. The amount of pressure required will depend on such factors as the hardness of the bump metallurgy and rheology of the underfill. A range of 50 to 350 kPa is typically used.

During the application of the compliant surface the coated semiconductor may either be at room temperature or heated, as required by the particular underfill composition employed.

In a preferred embodiment the underfill is hardened to a solid state prior to the removal of the pressure. This generally provides a more uniform underfill surface and minimizes sticking of the underfill to the compliant layer. Solidification of the underfill will preferably be accomplished through the cooling of the coated semiconductor below the melting point of the underfill, by exposing it to ambient conditions or a cooled environment. Solidification may also be accomplished by partially curing, or B-staging, the underfill. Alternatively, the compliant layer may be removed prior to the solidification of the underfill.

After the underfill has been applied in this manner there may remain a very thin layer of underfill on the exposed solder bumps. Depending on the metallurgy and process equipment utilized, in many cases this thin layer of underfill will not impede the proper formation of solder joints with the terminal pads on the substrate. The semiconductor may then be processed using conventional flip chip die attach methods. However, in some cases it may be desired or required to remove this thin layer of underfill material and this can be accomplished using mild mechanical abrasion or chemical etching methods.

Figure 3:
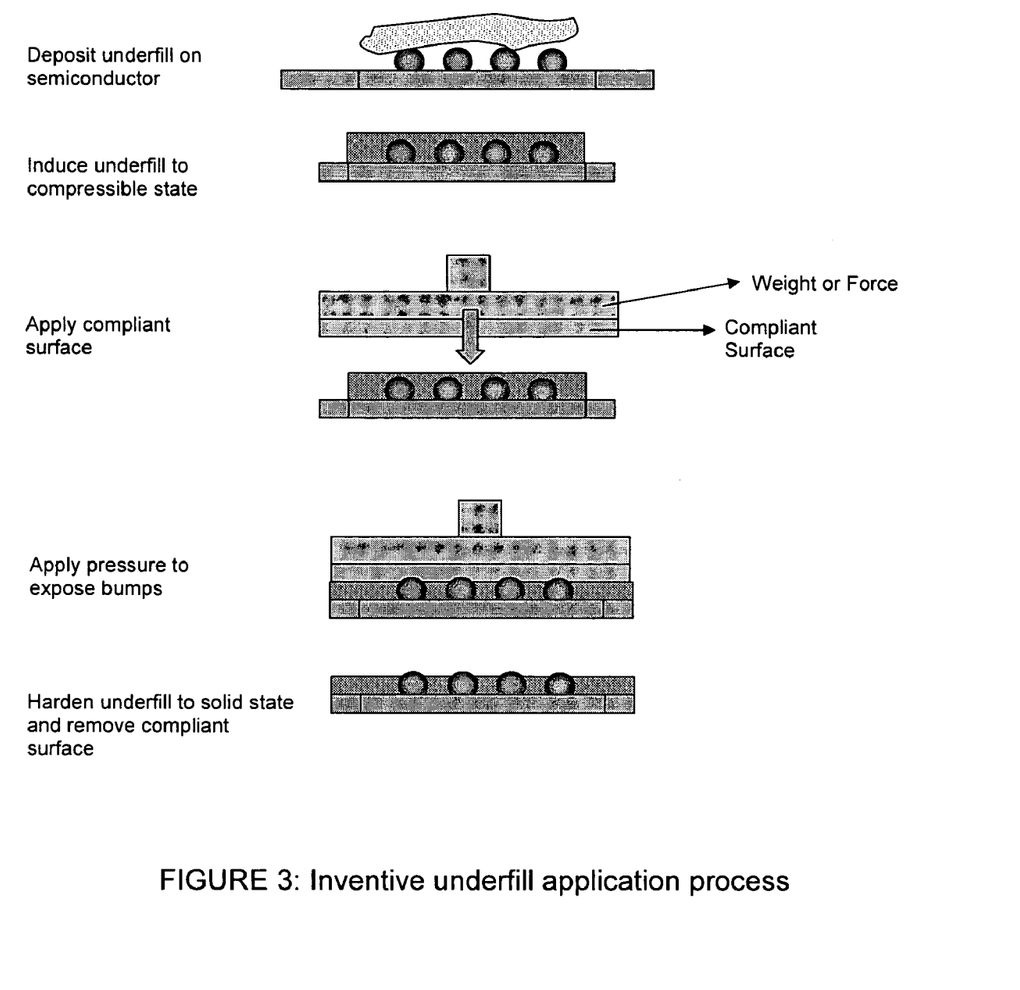
FIG. 3 depicts the inventive underfill application process.

The underfill process of this invention is shown in FIG. 3.

EXAMPLES

Coated semiconductor wafers were generated using three different processes for comparison. For all examples the wafers were 8-inch diameter, 750-micrometer thick silicon with 350 to 400 micrometer high eutectic ($Sn_{63}Pb_{37}$) solder bumps arranged at 1.3 mm pitch. The underfill used in all examples was an epoxy-based composition that is solid at room temperature and melts between 90-110° C.

Figure 4:
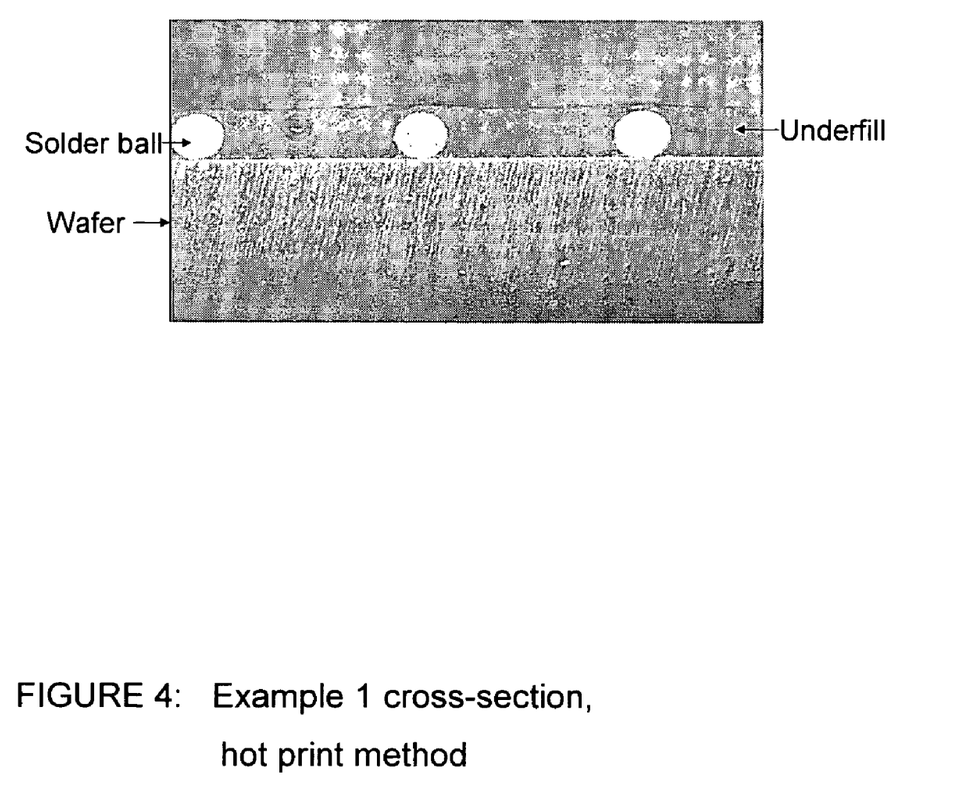
FIG. 4 depicts Example 1 cross-section, hot print method.

For Example 1, a comparative example, the wafer was coated using a standard hot print method where the adhesive was preheated to a temperature of 120° C. and printed on the wafer using a squeegee and stainless steel stencil 350 to 400 micrometers thick. The wafer was then exposed to ambient conditions until the underfill solidified, and a cross section of the coated wafer was examined using optical microscopy. The cross section, shown in FIG. 4, revealed a clearly detectable layer of underfill over the tops of the solder bumps. Another wafer coated in the same fashion was singulated into individual die for attach to a substrate. However, when used on a Metcal 1500 rework station, which is standard pick and place equipment, the optical recognition systems of the equipment were unable to detect the solder balls on the die and therefore the die could not be aligned and placed on a substrate. The layer of underfill covering the solder balls was too thick to enable attach to a substrate using pick and place equipment.

Figure 5:
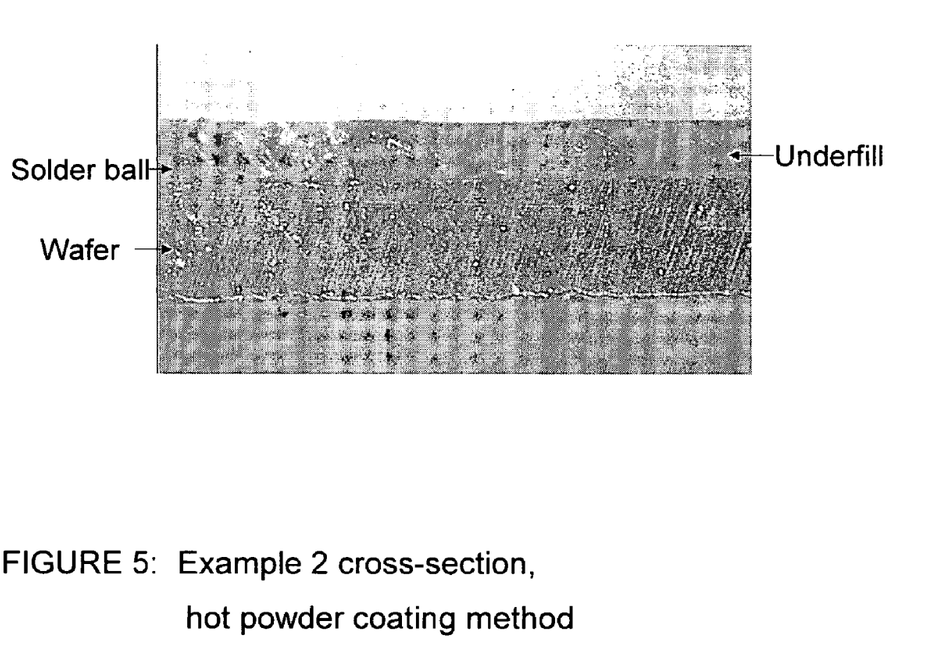
FIG. 5 depicts Example 2 cross-section, hot powder coating method.

In Example 2, a comparative example, the wafer was coated using a hot powder coating method. In this example the wafer was heated to 120° C. and a powder form of the underfill was slowly sprinkled onto the surface of the wafer. This application continued until sufficient material had been deposited such that the underfill completely covered the solder bumps. The coated wafer was cooled to ambient temperature and a cross section of the coated wafer was examined using optical microscopy. The cross section, shown in FIG. 5, revealed a clearly detectable layer of underfill over the tops of the solder bumps. Another wafer coated in the same fashion was singulated into individual die for attach to a substrate. However, when used on a Metcal 1500 rework station, which is standard pick and place equipment, the optical recognition systems of the equipment were unable to detect the solder balls on the die and therefore the die could not be aligned and placed on a substrate. The layer of underfill covering the solder balls was too thick to enable attach to a substrate using pick and place equipment.

Figure 6:
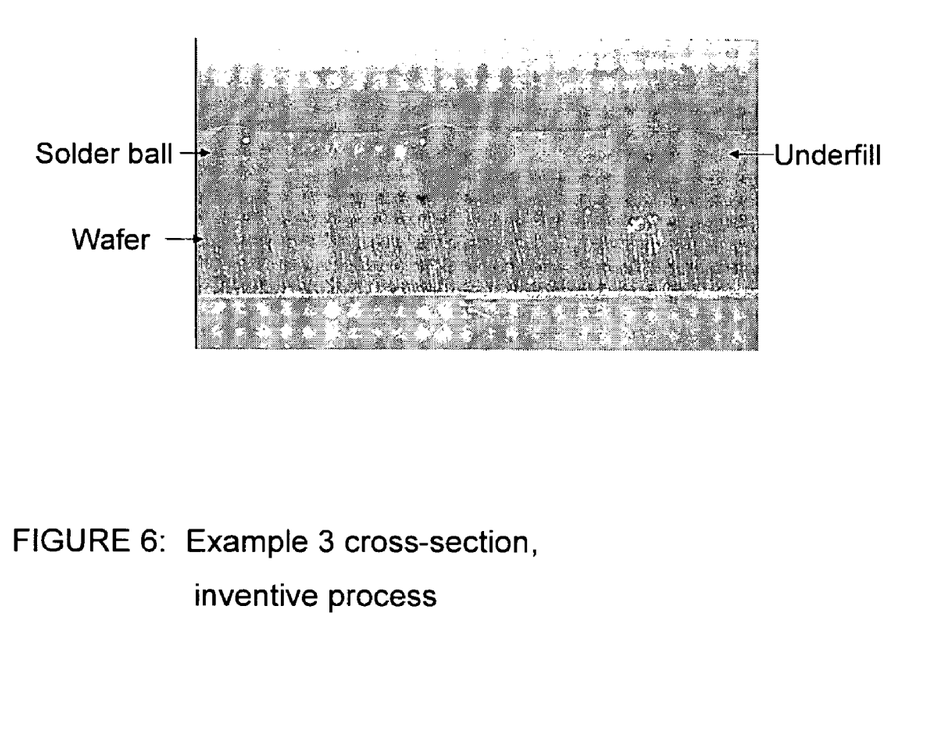
FIG. 6 depicts Example 3 cross-section, inventive process.

For Example 3 the wafer was coated using the inventive process. The compliant material used in this example was a fiberglass reinforced silicone rubber sheet, 1/16" thick, with a Shore A Durometer hardness of 60-80. The sheet of compliant material was attached to a platen and used as the pressing apparatus. The underfill was applied to the wafer using the hot powder coating method as described above. While the coated wafer was held at 90° C. to 120° C., the compliant material was pressed against the coated wafer using the pressing apparatus at approximately 50 kPa pressure for 7 minutes. The assembly was cooled to ambient temperature and the pressing assembly was then removed. A cross section of the coated wafer was examined using optical microscopy. The cross section, shown in FIG. 6, revealed the solder bumps protruding through the underfill, with only a very slight residual layer remaining on them.

Figure 7:
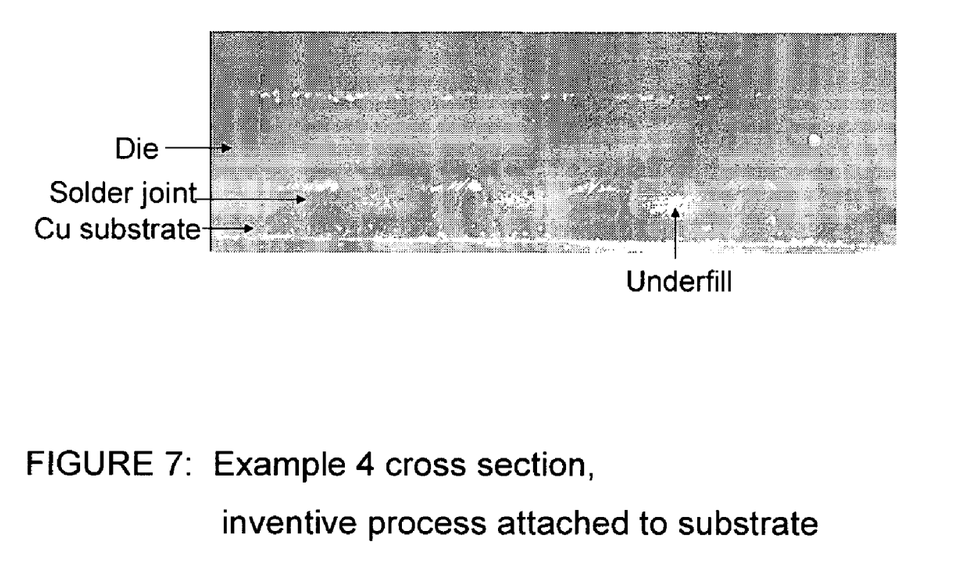
FIG. 7 depicts Example 4 cross-section, inventive process attached to substrate.

For Example 4 the wafer was coated using the inventive process, as described in Example 3. After the pressing assembly was removed the coated wafer was singulated into 7×7 mm die, which were attached to a substrate to determine their ability to form solder joints without an underfill removal step. The substrate used for this test was a copper plate with eutectic solder pads arranged in the same fashion as the solder bumps on the test die. A commercially available fluxing agent was printed onto the substrate at the height of the pad, approximately 180 to 220 micrometers. The die were then positioned in alignment with the solder pads on the substrate and attached using a Metcal 1500 rework station at room temperature. The assembly was then reflowed using a 220° C. peak temperature profile with 60 to 90 seconds above the solder liquidus. The resulting assembly was then cross-sectioned and examined via optical microscopy. As can be seen in FIG. 7, the cross section of the attached assembly, the solder balls reflowed and formed metallurgical joints with the bond pads on the substrate.

What is claimed:

1. A process for applying a solvent-free underfill onto a semiconductor having an array of solder bumps on a surface of the semiconductor, the process comprising:
   i. providing an underfill in a compressible state on the semiconductor,
   ii. contacting the underfill with a compliant surface and applying sufficient pressure to expose the solder bumps on the surface of the semiconductor,
   iii. hardening the underfill to a solid state, and
   iv. removing the compliant surface.

2. The process of claim 1 in which the underfill is provided by depositing it as a solid powder on the semiconductor and is converted to a compressible state by melting.

3. The process of claim 1 in which the underfill is deposited as a liquid onto the semiconductor.

4. The process of claim 1 in which the underfill is a curable epoxy resin.

5. The process of claim 1 in which the compliant surface is a silicone rubber.

6. The process of claim 1 in which the semiconductor is a silicon die.

7. The process of claim 1 in which the semiconductor is a silicon wafer.

8. A process for applying a solvent-free underfill onto a semiconductor having an array of solder bumps on a surface of the semiconductor, the process comprising:
   v. providing an underfill in a compressible state on the semiconductor,
   vi. contacting the underfill with a compliant surface and applying sufficient pressure to expose the solder bumps on the surface of the semiconductor,
   vii. removing the compliant surface.

9. The process of claim 8 in which the underfill is provided by depositing it as a solid powder on the semiconductor and is converted to a compressible state by melting.

10. The process of claim 8 in which the underfill is deposited as a liquid onto the semiconductor.

11. The process of claim 8 in which the underfill is a curable epoxy resin.

12. The process of claim 8 in which the compliant surface is a silicone rubber.

13. The process of claim 8 in which the semiconductor is a silicon die.

14. The process of claim 8 in which the semiconductor is a silicon wafer.

* * * * *